United States Patent [19]
Martin

[11] Patent Number: 5,809,038
[45] Date of Patent: Sep. 15, 1998

[54] METHOD AND APPARATUS FOR READING COMPRESSED TEST DATA FROM MEMORY DEVICES

[75] Inventor: Chris G. Martin, Boise, Id.

[73] Assignee: Micron Technology, Inc., Boise, Id.

[21] Appl. No.: 899,525

[22] Filed: Jul. 24, 1997

[51] Int. Cl.$^6$ .................................................. G06F 11/00
[52] U.S. Cl. ................................................................. 371/21.2
[58] Field of Search .............................. 371/21.2, 21.1, 371/21.3, 21.4, 21.6; 365/189.09, 226, 201

[56] References Cited

U.S. PATENT DOCUMENTS

| | | | |
|---|---|---|---|
| 4,991,139 | 2/1991 | Takahashi | 365/201 |
| 5,047,986 | 9/1991 | Miyamoto | 365/226 |

Primary Examiner—Vincent P. Canney
Attorney, Agent, or Firm—Seed and Berry LLP

[57] ABSTRACT

A test circuit for a memory device having a pair of arrays each of which includes a plurality of memory cells arranged in rows and columns, and a pair of complimentary digit lines being provided for each column of each array. The digit lines are selectively coupled to a pair of I/O lines for each array which are, in turn, coupled to a pair of complimentary data lines. The data lines are coupled to respective inputs of a sense amplifier, one of which is provided for each array. A multiplexer connects the pair of I/O lines for either one of the arrays to the data lines in a normal operating mode. Thus, in the normal operating mode, data is selectively coupled to the inputs of the sense amplifier from the complimentary digit lines for an addressed column. In a test mode, the multiplexer connects an I/O line for one array to one of the data lines and an I/O line for the other array to the other data line. Thus, in the test mode, data is simultaneously coupled to the inputs of the sense amplifier from respective digit lines of two different columns, thereby increasing the rate at which test data that has been written to the arrays can be read from the arrays.

37 Claims, 5 Drawing Sheets

METHOD AND APPARATUS FOR READING COMPRESSED TEST DATA FROM MEMORY DEVICES

TECHNICAL FIELD

This invention relates to integrated circuit memory devices, and, more particularly, to a method and apparatus for reading data from memory devices in a compressed manner to expedite testing of memory devices.

BACKGROUND OF THE INVENTION

Integrated circuits are extensively tested both during and after production and, in some cases, routinely during use after they have been installed in products. For example, memory devices, such as dynamic random access memories ("DRAMs"), are tested during production at the wafer level and after packaging, and they are also routinely tested each time a computer system using the DRAMs executes a power up routine when power is initially applied to the computer system. DRAMs are generally tested by writing known data to each location in the memory and then reading data from each memory location to determine if the read data matches the written data. As the capacity of DRAMs and other memory devices continues to increase, the time required to write and then read data from all memory locations continues to increase, even though memory access times continue to decrease.

Various proposals have been made to decrease the time required to test memory devices, such as DRAMs. The time required to write known data to memory devices has been reduced by such approaches as simultaneously writing the same data to each column of each array in the memory device one row at a time. Other approaches include internal circuitry for transferring data from each column of one row to the next without requiring the memory to be addressed. These approaches have reduced the time required to write known data or a known pattern of data to the memory array.

Solutions have also been proposed for reducing the time required to read data from memory devices so that the data can be compared to the data written to the memory devices. One approach to solving the problem of excessive read times relies on data compression in which data from the sense amplifier for one memory array is internally compared to the data from the sense amplifier of a different memory array. Simultaneously reading data from different memory locations in two different arrays has significantly reduced the time required to read data from memory devices for test purposes. However, combining data from multiple sense amplifiers requires the addition of circuitry and conductors to couple the outputs of the multiple sense amplifiers to comparison circuitry. As the circuit features of semiconductor devices become more compact, there is less space available to route conductors from each sense amplifier to a single location and to provide additional circuitry to combine the outputs of sense the amplifiers.

There is therefore a need to be able to read data from a memory device in a compressed form to reduce testing time that can be implemented on integrated circuits having highly compact circuit features.

SUMMARY OF THE INVENTION

The present invention is a test circuit for memory device of the type having at least one array of memory cells arranged in rows and columns, a pair of complimentary digit lines for each column, and a sense amplifier that couples data from the digit lines to an external data terminal of the memory device. In accordance with one aspect of the invention, the test circuit includes a switching circuit that operates in either a normal mode or a test mode. In the normal mode, the test circuit couples the inputs of a sense amplifier to a pair of digit lines for the same column. As a result, data can be read from the array in normal fashion. In the test mode, the test circuit couples the inputs of the sense amplifier to a pair of digit lines for different columns. As a result, data can be read from the array in compressed fashion, i.e., from two columns at a time, thereby increasing the rate at which the memory array can be tested after test data has been written to the array. Although the memory device may have only a single memory array, it may also have multiple arrays, in which case columns from different arrays may be coupled to the inputs of the sense amplifier in the test mode. Regardless of whether the different columns are in the same or different arrays, the digit lines coupled to the inputs of the sense amplifier in the test mode can both be either complimentary digit lines, non-complimentary digit lines, or a combination of complimentary and non-complimentary digit lines. The coupling between the inputs of the sense amplifier and the digit lines is preferably through a pair of data lines coupled to the inputs of the sense amplifier, a pair of I/O lines for each of the arrays to which the digit lines of an addressed column are connected, and a multiplexer selectively coupling two of the I/O lines to the data lines. In the normal operation mode, the multiplexer may couple the data lines to I/O lines for the same array, while in the test mode the multiplexer may couple the data lines to I/O lines for different arrays. The test circuit may be used in a memory device that is connected to a test system. In such case, the test system may first write a known pattern of data to the array followed by reading data from pairs of different columns of the memory device, as explained above. The read data is then examined to determine if the read data corresponds to the pattern of data written to the array, thereby providing an indication of whether the memory device is operating properly.

DETAILED DESCRIPTION OF THE INVENTION

Figure 1:
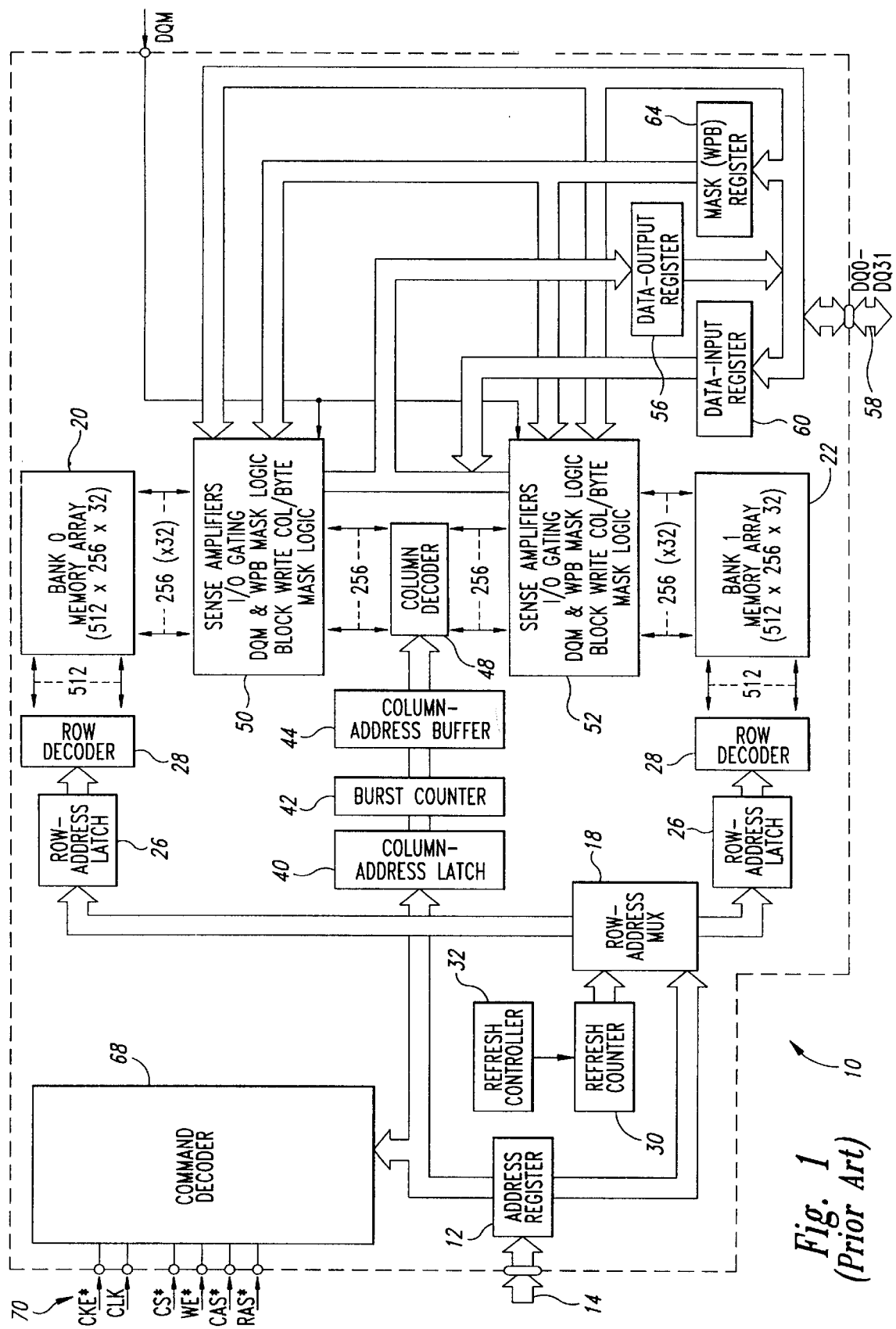
FIG. 1 is a block diagram of a conventional memory device that may use an embodiment of a test circuit in accordance with the present invention.

An embodiment of a memory device that can advantageously use an embodiment of a test circuit in accordance with the present invention is illustrated in FIG. 1. The memory device shown in FIG. 1 is a synchronous dynamic random access memory ("SDRAM") 10, although the test circuit may also be used in other DRAM's and other memory devices. The SDRAM 10 includes an address register 12 that receives either a row address or a column address on an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory banks 20, 22 depending upon the state of a bank address bit forming part of the row address. Associated with each of the memory banks 20, 22 is a respective row address latch 26 which stores the row address, and a row decoder 28 which applies various signals to its respective array 20 or 22 as a function of the stored row address. The row address multiplexer 18 also couples row addresses to the row address latches 26 for the purpose of refreshing the memory cells in the arrays 20, 22. The row addresses are generated for refresh purposes by a refresh counter 30 which is controlled by a refresh controller 32.

After the row address has been applied to the address register 12 and stored in one of the row address latches 26, a column address is applied to the address register 12. The address register 12 couples the column address to a column address latch 40. Depending on the operating mode of the SDRAM 10, the column address is either coupled through a burst counter 42 to a column address buffer 44, or to the burst counter 42 which applies a sequence of column addresses to the column address buffer 44 starting at the column address output by the address register 12. In either case, the column address buffer 44 applies a column address to a column decoder 48 which applies various column signals to respective sense amplifiers and associated column circuitry 50, 52 for the respective arrays 20, 22.

Data to be read from one of the arrays 20, 22 is coupled to the column circuitry 50, 52 for one of the arrays 20, 22, respectively. The data is then coupled to a data output register 56 which applies the data to a data bus 58. Data to be written to one of the arrays 20, 22 is coupled from the data bus 58 through a data input register 60 to the column circuitry 50, 52 where it is transferred to one of the arrays 20, 22, respectively. A mask register 64 may be used to selectively alter the flow of data into and out of the column circuitry 50, 52, such as by selectively masking data to be read from the arrays 20, 22.

The above-described operation of the SDRAM 10 is controlled by a command decoder 68 responsive to high level command signals received on a control bus 70. These high level command signals, which are typically generated by a memory controller (not shown in FIG. 1), are a clock enable signal CKE*, a clock signal CLK, a chip select signal CS*, a write enable signal WE*, a row address strobe signal RAS*, and a column address strobe signal CAS*, which the "*" designating the signal as active low. The command decoder 68 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these control signals will be omitted.

Figure 2:
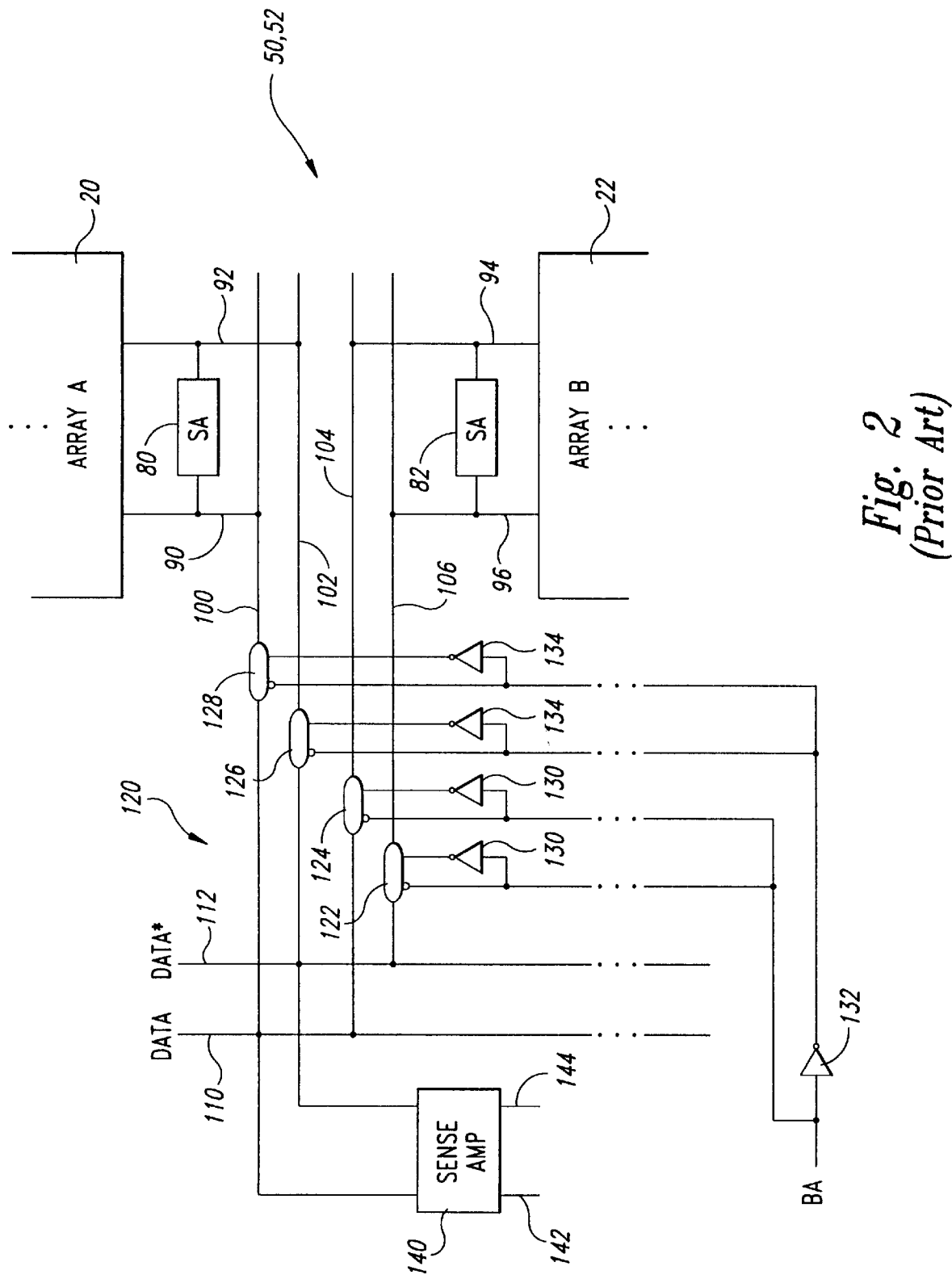
FIG. 2 is a block diagram of a portion of the memory device of FIG. 1 without a test circuit in accordance with the present invention.

To best understand the inventive test circuit, it is best to have an understanding of a portion of the circuitry conventionally used in the column circuitry 50, 52 in the SDRAM 10 of FIG. 1. With reference to FIG. 2, the column circuitry 50, 52 for each of the memory arrays 20, 22 typically includes a sense amplifier 80, 82 for each column in each array 20, 22, respectively. The sense amplifiers 80, 82 receive signals and apply signals to a pair of complimentary digit lines 90, 92 and 94, 96. Thus, for example, when data being read from a column in array A is "1," the digit line 90 will be at a logic "1" and the complimentary digit line 92 will be at logic "0."

As mentioned above, a large number of sense amplifiers 80, 82 are provided for each array 20, 22, respectively. The digit lines 90, 92 and 94, 96 of each sense amplifier 80, 82 are selectively applied to complimentary I/O lines 100, 102 and 104, 106 by column addressing circuitry which is not shown in FIG. 2 for purposes of brevity. There is one pair of I/O lines 100, 102 and 104, 106 for each array 20, 22, respectively. In operation, when the column for which the sense amp 80 is provided is addressed, the digit lines 90, 92 are coupled to the I/O lines 100, 102, respectively, by the column addressing circuitry in the column circuitry 50 (FIG. 1). Similarly, when the column for which the sense amp 82 is provided is addressed, the digit lines 94, 96 are coupled to the complimentary I/O lines 104, 106, respectively, by the column addressing circuitry in the column circuitry 52 (FIG. 1).

The I/O lines 100–106 are selectively coupled to a pair of complimentary data lines 110, 112 by a multiplexer 120 formed by pass gates 122, 124, 126, 128. The pass gates 122, 124 are controlled by the bank address bit BA either directly or through respective inverters 130. The pass gates 126, 128 are controlled by the inverse of the bank address signal BA at the output of an inverter 132 either directly or through inverters 134. When BA is high, the output of the inverter 132 is low to turn on the pass gates 126, 128. Thus, when BA is high, the I/O lines 100, 102 for the array 20 are coupled to the data lines 110, 112. When the BA bit is low, the pass gates 122, 124 are turned on to couple the I/O lines 104, 106 for the array 22 to the data lines 110, 112. The data lines 110, 112 are, in turn, coupled to the inputs of a sense amplifier 140 having complimentary output terminals 142, 144 that are normally coupled to or part of the data output register 56 (FIG. 1).

In the past, data compression of read data has been accomplished by coupling the output terminals 142, 144 of several sense amplifiers for respective arrays to comparison circuitry fabricated on the integrated circuit along with the memory device 10. However, as explained above, with the increasing compactness of memory devices and increases in the number of arrays, it has become more difficult to provide the conductors and circuitry to couple the output terminals 142, 144 of several sense amplifiers 140 to comparison circuitry.

Figure 3:
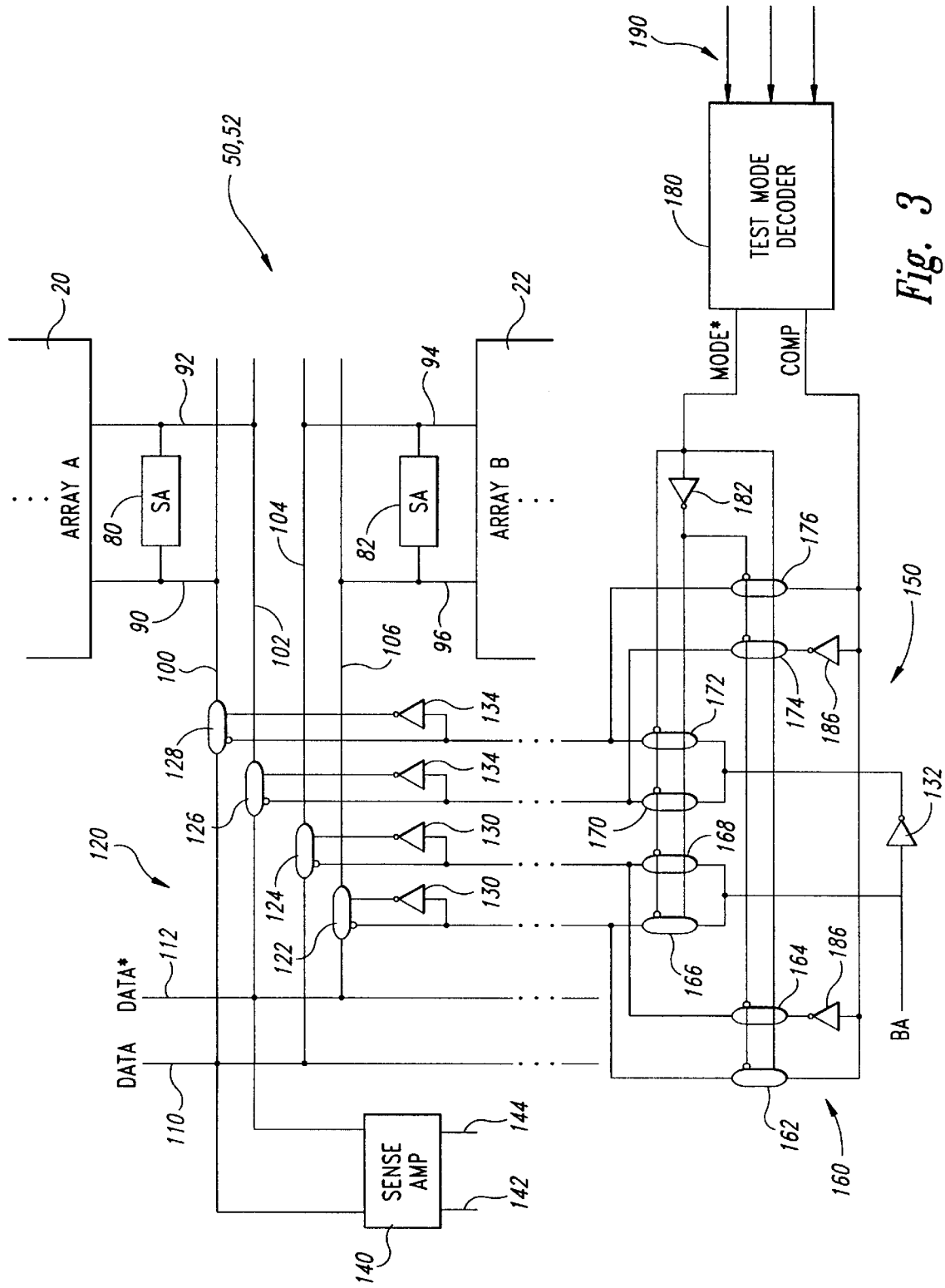
FIG. 3 is a block diagram of a portion of the memory device of FIG. 1 using an embodiment of a test circuit in accordance with the present invention.

One embodiment of test circuitry 150 that may be used in the column circuitry 50, 52 of the SDRAM 10 of FIG. 1 is illustrated in FIG. 3. An advantage of the test circuitry 150 illustrated in FIG. 3 is that it utilizes many of the components that are already present in the SDRAM 10 as shown in FIG. 2. Thus, for purposes of clarity and brevity, these components in FIG. 3 have been provided with the same reference numeral, and a detailed explanation of their operation will not be repeated.

The test circuit 150 uses a switching circuit 160 or a multiplexer to control the pass gates 122–128 from either the bank address BA bit or a comparison signal COMP produced as explained above. The switching circuit 160 is implemented using a plurality of pass gates 162, 164, 166, 168, 170, 172, 174, 176. When enabled, the pass gates 166, 168 route the bank address BA bit to the pass gates 122, 124 in the same manner as described above in FIG. 2. Similarly, when the pass gates 170, 172 are enabled, they route the inverse of the bank address BA bit at the output of the inverter 132 to the pass gates 126, 128 as described above with reference to FIG. 2.

The pass gates 166–172 are controlled by a MODE* signal generated at the output of a test mode decoder 180 which is described further below. The active low MODE* signal and its complement at the output of an inverter 182 enable the pass gates 166–172. When MODE* is inactive high, the pass gates 166–172 are disabled. The MODE* signal also controls the conductive states of the pass gates 162, 164, 174, 176. An inactive high MODE* signal and its complement at the output of the inverter 182 enables the pass gates 162, 164 and 174, 176. In this condition, the pass gates 122–128 are controlled by the COMP signal. A low COMP signal is coupled through the pass gates 162, 176 to turn on the pass gates 122, 128. The pass gates 122, 128 then couple the digit line 90 from the array 20 and the digit line 96 from the array 22 to the inputs of the sense amplifier 140 through the I/O lines 100, 106, respectively. Thus, when COMP is low, the non-complimentary digit line 90 from the array 20 and the complimentary digit line 96 from the array 22 are coupled to the sense amplifier 140.

When COMP is high, its complement generated at the output of inverters 186 enables the pass gates 124, 126. The pass gates 124, 126 then couple the digit line 92 from the array 20 and the digit line 94 from the array 22 to the sense amplifier 140 through the I/O lines 102, 104, respectively. Thus, regardless of the state of the COMP signal, the signal at the output of the sense amplifier 142 is based on the data stored in two different columns of two different arrays 20, 22. As a result, the time required to read the data from the SDRAM 10 for test purposes is half the time required to read the data using the prior art circuitry of FIG. 2. In operation, it is not necessary to perform tests with the COMP signal at two different values since all of the memory cells in both of the arrays 20, 22 are read with COMP remaining either high or low.

As mentioned above, the MODE* and COMP signals are generated by a conventional test mode decoder 180. The test mode decoder 180 includes conventional decoder circuitry having inputs 190 that are coupled to externally accessible terminals of the SDRAM 10. In response to combinations of input signals that are not provided during normal operation, the test mode decoder 180 generates the desired MODE* and COMP signals.

Although the test circuitry 150 shown in FIG. 3 couples complimentary and non-complimentary digit lines of different arrays 20, 22 to the sense amplifier 140, other combinations are possible in accordance with the present invention. For example, the test circuitry 150 could couple digit lines of different columns in the same memory array to the inputs of the sense amplifier 140. Also, although the test circuitry 150 shown in FIG. 3 couples complimentary and non-complimentary digit lines to the sense amplifier 140, it could also be adapted to couple complimentary digit lines of different columns in the same or different arrays to the sense amplifier 140 such as, for example, coupling the I/O line 100 and the I/O line 104 to the sense amplifier 140. Regardless of which combination is used, the only requirement is that a digit line of two different columns are coupled to respective inputs of the sense amplifier 140.

In operation, the SDRAM 10 is tested using the test circuitry 150 of FIG. 3 by first writing known data to the memory arrays 20, 22 by conventional means. The data may be written by addressing individual memory cells or by using conventional approaches for writing data to the memory arrays 20, 22 for test purposes, as explained above. For example, a logic "1" may be written to each memory cell in the arrays 20, 22 so that when the data are read, the non-complimentary digit lines 90, 94 will be logic "1" and the complimentary digit lines 92, 96 will be logic "0." Under these circumstances, the sense amplifier 140 will receive the same signals as when reading a logic "1" from a memory cell (i.e., D="1" and D*="0") thereby generating a logic "1" on its output terminal 142 and a logic "0" on its output terminal 144. However, it will be understood that logic "0" may be written to all memory cells in the arrays 20, 22 or data in some other pattern, such as a checkerboard pattern, may be written to the arrays 20, 22. In any case, as long as the data are written to the arrays 20, 22 in a known pattern, the compressed data applied to the sense amplifier 140 can provide an indication of whether the memory cells in the arrays 20, 22 are operating properly.

Figure 4:
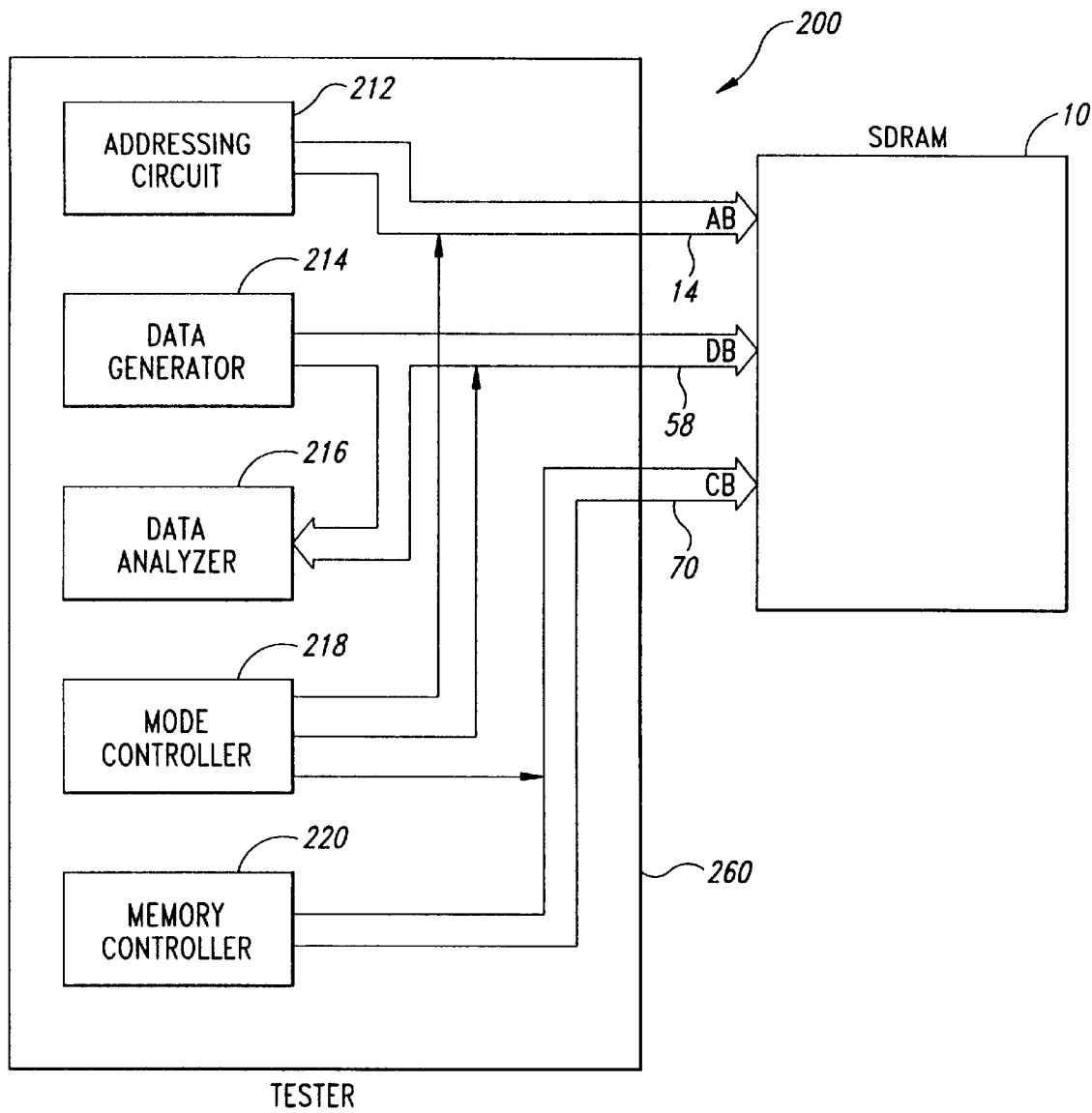
FIG. 4 is a block diagram of the memory device of FIGS. 1 and 3 used with a test system to determine whether the memory device is operating properly.

A testing system 200 for testing the SDRAM 10 containing the test circuit 150 of FIG. 3 is shown in FIG. 4. The SDRAM 10 is connected through its address bus 14, data bus 58, and control bus 70 to a tester 260 that includes an addressing circuit 212 connected to the address bus 14, a data generator 214 connected to the data bus 58, a data analyzer 216 also connected to the data bus 58, a mode controller 218 connected to a plurality of externally accessible terminals of the SDRAM 10 in one or more of the buses 14, 58, 70, and a memory controller 220 providing central signals to the SDRAM 10 on the control bus 70.

In operation, the data generator 214 applies predetermined data to the data bus 58 while the addressing circuit 212 applies suitable addresses to the address bus 14 to cause the data on the bus 58 to be written into the SDRAM 10 under control of the memory controller 220. During this time, the mode controller 218 generates and applies combinations of signals to the external terminals of the SDRAM 10 to cause the test mode decoder 180 to generate the MODE* and COMP signals as desired. After known data has been written to the memory arrays 20, 22, the mode controller 218 generates a combination of signals to cause the test mode decoder 180 to drive MODE* high thereby placing the test circuitry 150 in the test mode. The addressing circuitry 212 then addresses the memory cells of the arrays 20, 22 under control of the memory controller 220 to apply compressed data to the sense amplifier 140. The resulting data signals at the output terminals 142, 144 of the sense amplifier 140 are coupled through the data bus 58 to the data analyzer 216. The data analyzer 216 determines whether the data read from the SDRAM 10 corresponds to the data that was written to the SDRAM 10. Although the inventive test system is shown as being used to test an SDRAM 10, it will be understood that it may be used to test other types of DRAMs and other types of memory devices.

The addressing circuits 212, data generator 214, data analyzer 216, mode controller 218, and memory controller 220 can be implemented by a variety of means with relative ease by one skilled in the art. For example, these components can be implemented in software executed by a computer system. Alternatively, the addressing circuit 212 can be implemented by a counter that outputs incrementally increasing addresses, the data generator 214 can be implemented by a set of pull-up resistors that simply hold the lines of the data bus 58 at logic "1," the data analyzer 216 can be implemented by a latch that detects a predetermined logic level, the mode controller 218 can be implemented by a logic circuit that generates predetermined combinations of signals, and the memory controller 220 can be implemented by a conventional memory controller. The tester 260 and its internal components are preferably controlled by a conventional computer system (not shown).

Figure 5:
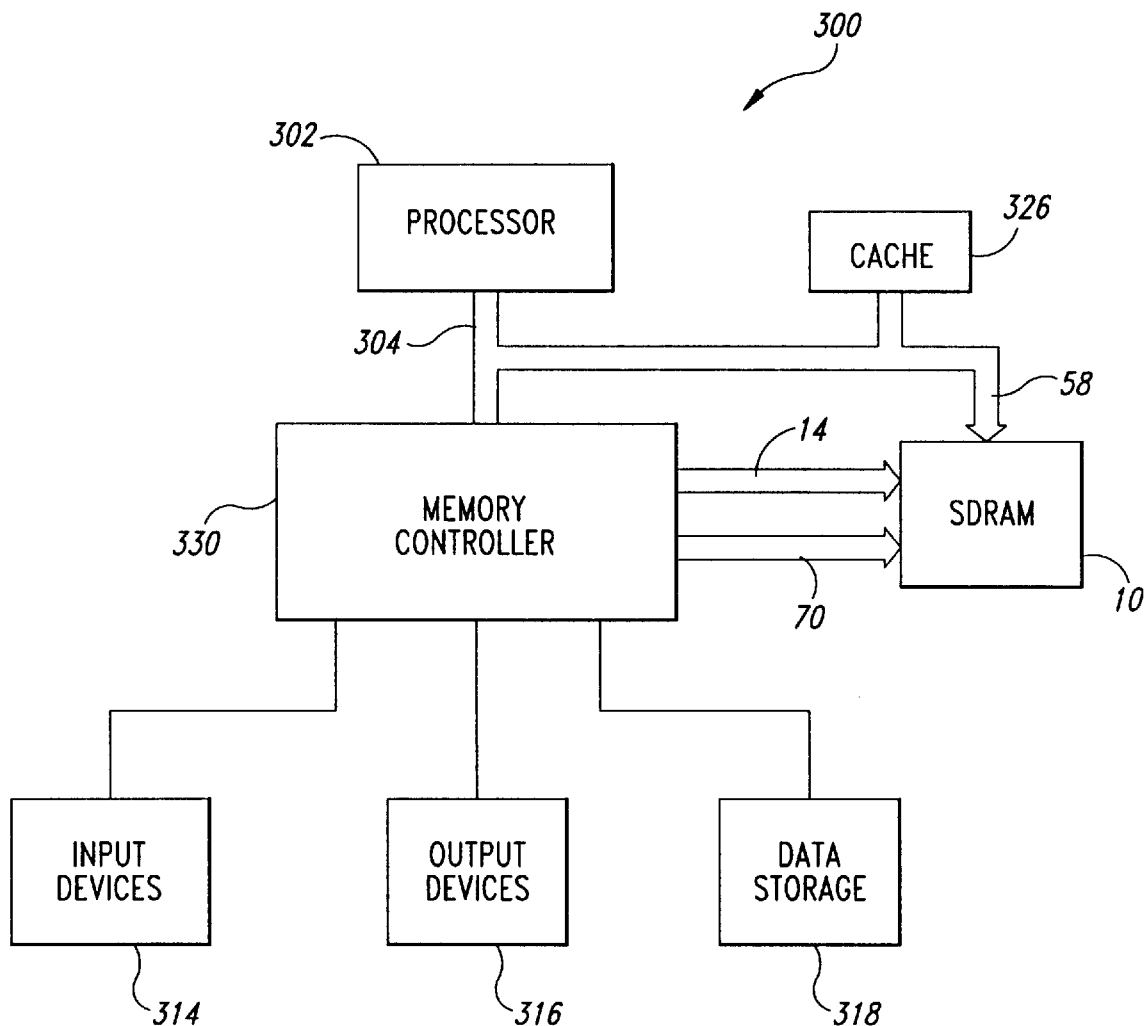
FIG. 5 is a block diagram of a computer system using the memory device of FIGS. 1 and 3.

FIG. 5 is a block diagram of a computer system 300 which includes the SDRAM 10 of FIGS. 1 and 3. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data or retrieve data from internal or external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM") and to the SDRAM 10 through a memory controller 330. The memory controller 330 normally includes the control bus 70 and the address bus 14 that is coupled to the SDRAM 10. The data bus 58 may be coupled to the processor bus 304 either directly (as shown), through the memory controller 330, or by some other means.

Although the present invention has been described with reference to a preferred embodiment, the invention is not limited to this preferred embodiment. Rather, the invention is limited only by the appended claims, which include within their scope all equivalent devices or methods which operate according to the principles of the invention as described.

I claim:

1. In a memory device having at least one memory array containing a plurality of memory cells arranged in rows and columns, a sense amplifier having a pair of inputs and an output coupled to an externally accessible data terminal of the memory device, a pair of respective data lines coupled to the inputs of the sense amplifier, at least one pair of I/O lines that may be coupled to the pair of data lines, respectively, and a pair of complimentary digit lines for each column that may be coupled to the pair of I/O lines, a test circuit for facilitating the testing of the memory device, comprising a switching circuit coupled between the inputs of the sense amplifier and a pair of digit lines for one column of the array and between at least one of the inputs of the sense amplifier and a digit line for another column of an array, the switching circuit selectively operating in either a normal mode or a test mode, the switching circuit, when operating in the normal mode, coupling the inputs of the sense amplifier to the pair of digit lines for one column of the array, and the switching circuit, when operating in the test mode, coupling one of the inputs of the sense amplifier to one of the pair of digit lines for one column of the array and another of the inputs of the sense amplifier to one of the pair of digit lines for the other column of an array.

2. The test circuit of claim 1 wherein the switching circuit is connected between the pair of digit lines and at least one pair of I/O lines.

3. The test circuit of claim 1 wherein the columns for the digit lines that the switching circuit couples to in inputs of the sense amplifier in the test mode are in different arrays of the memory device.

4. The test circuit of claim 1 wherein the switching circuit comprises a plurality of pass gates selectively coupling the pair of data lines to a pair of I/O lines for a first array and a pair of I/O lines for a second array.

5. The test circuit of claim 4 further comprising a control circuit for the pass gates, the control circuit turning on the pass gates coupling the pair of data lines to either the pair of I/O lines for a first array or the pair of I/O lines for the second in the normal mode and coupling the pair of data lines to one of I/O lines for the first array and one of the I/O lines for the second array in the test mode.

6. The test circuit of claim 1 wherein the memory device comprises a dynamic random access memory.

7. The test circuit of claim 1 wherein when the switching circuit is in the test mode, the one input of the sense amplifier is coupled to a non-complimentary digit line for one column the other inputs of the sense amplifier to a complimentary digit line for the other column.

8. A memory device having an address bus and a data terminal, comprising:

at least one array of memory cells arranged in rows and columns, each of the rows having a row line and each of the columns having a pair of complimentary digit lines;

a row address circuit coupled to the address bus for activating a row line corresponding to a row address coupled to the row address circuit through the address bus;

a column address circuit coupled to the address bus for coupling to a pair of I/O lines a pair of digit lines for a column corresponding to a column address coupled to the column address circuit through the address bus;

a sense amplifier having a pair of inputs and an output coupled to the data terminal of the memory device, and a switching circuit operating in a normal mode to couple the inputs of the sense amplifier to a pair of digit lines for the same column and operating in a test mode to couple the inputs of the sense amplifier to a pair of digit lines for different columns.

9. The memory device of claim 8 wherein the different columns for which the digit lines are coupled to the inputs of the sense amplifier in the test mode are in different arrays of the memory device.

10. The memory device of claim 8 wherein the memory device comprises a dynamic random access memory.

11. The memory device of claim 8 wherein one of the digit lines coupled to the input of the sense amplifier in the test mode is a non-complimentary digit line and the other of the digit lines coupled to the input of the sense amplifier in the test mode is a complimentary digit line.

12. A memory device having an address bus and a data terminal, comprising:

first and second arrays of memory cells in which the memory cells in each array are arranged in rows and columns, each of the rows having a row line and each of the columns having a pair of complimentary digit lines;

a row address circuit coupled to the address bus for activating a row line in one of the arrays corresponding to a row address applied to the row address circuit through the address bus;

a column address circuit coupled to the address bus for coupling a respective pair of I/O lines for each array to a pair of digit lines corresponding to a column address applied to the column address circuit through the address bus;

a sense amplifier having a pair of inputs coupled to a pair of data lines and an output coupled to the data terminal of the memory device, and a switching circuit operating in a normal mode to couple the I/O lines for either the first or the second arrays to the data line and operating in a test mode to couple one of the I/O lines for the first array to one of the data lines and to couple one of the I/O lines for the second array to the other of the data lines.

13. The memory device of claim 12 wherein the memory device comprises a dynamic random access memory.

14. The memory device of claim 12 wherein the I/O line for the first array that is coupled to the one data line is a non-complimentary I/O line and the I/O line for the second array that is coupled to the other data line is a complimentary I/O line.

15. A system for testing a memory device having an array of memory cells arranged in rows and columns, each of the columns having a pair of complimentary digit lines, addressing circuits coupled to an address bus for selecting memory cells to which data are written and from which data are read, and a sense amplifier having an output coupled to a data terminal of the memory device; the test system comprising:
 a switching circuit included in the memory device, the switching circuit being controlled by a mode signal to operate in either a normal mode or a test mode, the switching circuit operating in the normal mode to couple digit lines of the same column to respective inputs of the sense amplifier and operating in a test mode to couple digit lines of different columns to respective inputs of the sense amplifier;
 a mode control circuit included in the memory device, the mode control circuit having an output terminal and a plurality of input terminals coupled to externally accessible input terminals of the memory device, the mode control circuit generating a mode control signal to cause the switching circuit to operate in the normal mode responsive to a first combination of signals applied to the externally accessible input terminals and generating a mode control signal to cause the switching circuit to operate in the test mode responsive to a second combination of signals applied to the externally accessible input terminals; and
 a testing device external to the memory device, the testing device including addressing circuits for applying addresses to the address bus of the memory device, a mode controller for selectively applying the first and second combination of signals to the externally accessible input terminals of the memory device, a data generating circuit to apply write data to the data terminal of the memory device, and a data analyzing circuit for examining read data coupled from the data terminal of the memory device in the test mode to determine if the read data corresponds to the write data.

16. The test system of claim 15 wherein the different columns for which the digit lines are coupled to the inputs of the sense amplifier in the test mode are in different arrays of the memory device.

17. The test system of claim 15 wherein the memory device comprises a dynamic random access memory.

18. The test system of claim 15 wherein one of the digit lines coupled to the input of the sense amplifier in the test mode is a non-complimentary digit line and the other of the digit lines coupled to the input of the sense amplifier in the test mode is a complimentary digit line.

19. A computer system, comprising:
 a processor having a processor bus;
 an input device coupled to the processor through the processor bus and adapted to allow data to be entered into the computer system;
 an output device coupled to the processor through the processor bus adapted to allow data to be output from the computer system; and
 a memory device coupled to the processor through the processor bus, the memory device comprising:
 at least one array of memory cells arranged in rows and columns, each of the rows having a row line and each of the columns having a pair of complimentary digit lines;
 a row address circuit adapted to receive and decode a row address, and select a row of memory cells corresponding to the row address;
 a column address circuit adapted to couple a pair of digit lines for a column corresponding to a column address to a pair of I/O lines to receive or apply data to one of the memory cells in the selected row corresponding to a column address; and
 a data path circuit adapted to couple data between an external data terminal and each of a plurality of pairs of complimentary digit lines for respective columns; the data path circuit including a sense amplifier having a pair of inputs and an output coupled to the external data terminal of the memory device, and
 a switching circuit operating in a normal mode to couple the inputs of the sense amplifier through a pair of the I/O lines to a pair of digit lines for the same column and operating in a test mode to couple the inputs of the sense amplifier through a pair of the I/O lines to a pair of digit lines for different columns.

20. The computer system of claim 19 wherein the different columns for which the digit lines are coupled to the inputs of the sense amplifier in the test mode are in different arrays of the memory device.

21. The computer system of claim 19 wherein the memory device comprises a dynamic random access memory.

22. The computer system of claim 19 wherein one of the digit lines coupled to the input of the sense amplifier in the test mode is a non-complimentary digit line and the other of the digit lines coupled to the input of the sense amplifier in the test mode is a complimentary digit line.

23. A computer system, comprising:
 a processor having a processor bus;
 an input device coupled to the processor through the processor bus and adapted to allow data to be entered into the computer system;
 an output device coupled to the processor through the processor bus adapted to allow data to be output from the computer system; and
 a memory device coupled to the processor through the processor bus, the memory device comprising:
 first and second arrays of memory cells in which the memory cells in each array are arranged in rows and columns, each of the rows having a row line and each of the columns having a pair of complimentary digit lines;
 a row address circuit coupled to the address bus for activating a row line in one of the arrays corresponding to a row address applied to the row address circuit through the address bus;
 a column address circuit coupled to the address bus for coupling a respective pair of I/O lines for each array to a pair of digit lines corresponding to a column address applied to the column address circuit through the address bus;
 a data path circuit adapted to couple data between an external data terminal and each of a plurality of pairs of complimentary digit lines for respective columns, the data path circuit including a sense amplifier having a pair of inputs coupled to a pair of data lines and an output coupled to the external data terminal of the memory device, and a switching circuit operating in a normal mode to couple the I/O lines for either the first or the second arrays to the pair of data lines, respectively, and operating in a test mode to couple one of the I/O lines for the first array to one of the data lines and to couple one of the I/O lines for the second array to the other of the data lines.

24. The computer system of claim 23 wherein the memory device comprises a dynamic random access memory.

25. The computer system of claim 23 wherein the I/O line for the first array that is coupled to the one data line is a non-complimentary I/O line and the I/O line for the second array that is coupled to the other data line is a complimentary I/O line.

26. A method of testing a memory device of the type having at least one array of memory cells arranged in rows and columns, each of the columns having a pair of complimentary digit lines on which data is written to and read from the array, the method comprising:

writing a known pattern of data to the array;

sequentially reading data from pairs of different columns of the memory device by coupling a respective digit line for each of the different columns to an externally accessible data terminal; and examining the read data applied to the externally accessible data terminal to determine whether the read data corresponds to the pattern of data written to the array.

27. The method of claim 26 wherein the steps of writing data and reading data comprises the step of:

writing data to a plurality of columns in a first array;

writing data to a plurality of columns in a second array;

sequentially reading data from pairs of columns in which one of the columns in each pair is in the first array and the other of the columns in each pair is in the second array.

28. The method of claim 26 wherein the memory device includes a sense amplifier having a pair of input terminals, and the array includes a pair of complimentary digit lines for each column of the array, and wherein the step of reading data comprises the steps of:

sequentially coupling the digit lines for each of a plurality of different columns in the array to respective input terminals of the sense amplifier; and simultaneously transferring data from each of the pairs of different columns to the respective digit lines that are coupled to the input terminals of the sense amplifier.

29. The method of claim 26 wherein the step of sequentially coupling the digit lines for each of a plurality of different columns in the array to respective input terminals of the sense amplifier comprises the step of sequentially coupling the complimentary digit line for a plurality of columns in the array to one input terminal of the sense amplifier while coupling the non-complimentary digit line for a different column in the array to the other input terminal of the sense amplifier.

30. The method of claim 26 wherein the memory device comprises a dynamic random access memory.

31. A method of operating a memory device having at least one memory array containing a plurality of memory cells arranged in rows and columns, a sense amplifier having a pair of input terminals and an output coupled to an externally accessible data terminal of the memory device, and a pair of complimentary digit lines for each column of the memory array, the method comprising:

in a normal operating mode, coupling the complimentary digit lines of a selected column to respective input terminals of the sense amplifier, the selected column being determined by a column address applied to the memory device; and in a test mode, coupling a digit line from each of two different selected columns to respective input terminals of the sense amplifier, the selected column being determined by at least one column address applied to the memory device.

32. The method of claim 31 wherein the step of coupling a digit line from each of two different selected columns to respective input terminals of the sense amplifier comprises the step of coupling the complimentary digit line for one column to one input terminal of the sense amplifier while coupling the non-complimentary digit line for a different column in the array to the other input terminal of the sense amplifier.

33. The method of claim 31 wherein the memory device comprises a dynamic random access memory.

34. The method of claim 31 wherein the step of coupling a digit line from each of two different selected columns to respective input terminals of the sense amplifier comprises the step of coupling a digit line for a column in one memory array to one input terminal of the sense amplifier while coupling a digit line for a column of a different memory array to the other input terminal of the sense amplifier.

35. A method of operating a memory device having first and second memory arrays each containing a plurality of memory cells arranged in rows and columns, a pair of complimentary data lines; a data path circuit coupled between the data lines and an externally accessible data terminal of the memory device, first and second pairs of I/O lines corresponding to the first and second arrays, respectively, each of the I/O lines being selectively coupled to the data lines, and a pair of complimentary digit lines for each column of each memory array that may be coupled to the pair of I/O lines corresponding to the respective array, the method comprising:

coupling the digit lines for a column in the first array to respective I/O lines for the first array;

in a normal operating mode, coupling the I/O lines for the first array to respective data lines;

in the normal operating mode, transferring data through the data path circuit from the externally accessible data terminal to the data lines thereby writing data to the first array;

in the normal operating mode, transferring data through the data path circuit from the data lines to the externally accessible data terminal thereby reading data from the first array;

in a test mode, coupling an I/O line corresponding to the first array to one data line while coupling an I/O line corresponding to the second array to the other data line; and in the test mode, transferring data through the data path circuit from the data lines to the externally accessible data terminal thereby simultaneously deriving test data from first and second columns in the first and second arrays, respectively.

36. The method of claim 35 wherein the memory device comprises a dynamic random access memory.

37. The method of claim 35 wherein the step of coupling an I/O line corresponding to the first array to one data line while coupling an I/O line corresponding to the second array to the other data line in the test mode comprises the steps of coupling the complimentary I/O line for the first array to a complimentary data line while coupling the non-complimentary I/O line for the second array to a non-complimentary data line.

* * * * *